(12) United States Patent
Tanaka

(10) Patent No.: US 9,978,617 B2
(45) Date of Patent: May 22, 2018

(54) SUBSTRATE CLEANING APPARATUS AND SUBSTRATE PROCESSING APPARATUS

(71) Applicant: EBARA CORPORATION, Tokyo (JP)

(72) Inventor: Hideaki Tanaka, Tokyo (JP)

(73) Assignee: EBARA CORPORATION, Tokyo (JP)

(*) Notice: Subject to any disclaimer, the term of this patent is extended or adjusted under 35 U.S.C. 154(b) by 412 days.

(21) Appl. No.: 14/422,248

(22) PCT Filed: Aug. 20, 2013

(86) PCT No.: PCT/JP2013/072177
§ 371 (c)(1),
(2) Date: Feb. 18, 2015

(87) PCT Pub. No.: WO2014/030640
PCT Pub. Date: Feb. 27, 2014

(65) Prior Publication Data
US 2015/0221531 A1   Aug. 6, 2015

(30) Foreign Application Priority Data
Aug. 20, 2012 (JP) .................................. 2012-181670

(51) Int. Cl.
*H01L 21/304* (2006.01)
*B08B 1/04* (2006.01)
(Continued)

(52) U.S. Cl.
CPC ...... *H01L 21/67092* (2013.01); *A46B 13/001* (2013.01); *A46B 15/0012* (2013.01);
(Continued)

(58) Field of Classification Search
CPC ................ B08B 1/04; H01L 21/02041; H01L 21/02096; H01L 21/304; H01L 21/670902; H01L 21/67046
(Continued)

(56) References Cited

U.S. PATENT DOCUMENTS

| | | | | |
|---|---|---|---|---|
| 5,475,889 | A | * 12/1995 | Thrasher | .................. B08B 1/04 |
| | | | | 15/77 |
| 2002/0029431 | A1 | 3/2002 | Iokawa et al. | |
| 2011/0308545 | A1* | 12/2011 | Luechinger | ....... H01L 31/02008 |
| | | | | 134/6 |

FOREIGN PATENT DOCUMENTS

| | | | |
|---|---|---|---|
| JP | 59-193029 | * | 11/1984 |
| JP | 07-135192 A | | 5/1995 |

(Continued)

OTHER PUBLICATIONS

International Search Report for Application No. PCT/JP2013/072177 dated Nov. 19, 2013.

*Primary Examiner* — Mark Spisich
(74) *Attorney, Agent, or Firm* — Pearne & Gordon LLP

(57) ABSTRACT

The present invention relates to a substrate cleaning apparatus for performing scrub cleaning of a surface of a substrate by rotating both of the substrate and a roll cleaning member while keeping the roll cleaning member in contact with the surface of the substrate. The substrate cleaning apparatus includes a roll holder (42) configured to support and rotate a roll cleaning member (46), a vertical movement mechanism (60), having a vertically movable unit (58) vertically movable by actuation of an actuator (56) having a regulating device (62), configured to vertically move the roll holder (42) coupled to the vertically movable unit (58) so that the roll cleaning member (46) applies a roll load to the substrate W at the time of cleaning the substrate, a load cell (54) provided between the vertically movable unit (58) of the vertical movement mechanism (60) and the roll holder (42) and configured to measure the roll load, and a controller (66) configured to perform feedback control of the roll load through the regulating device (62) of the actuator (56) based on a measured value of the load cell (54).

12 Claims, 9 Drawing Sheets

(51) Int. Cl.
  *H01L 21/67*  (2006.01)
  *H01L 21/02*  (2006.01)
  *B08B 1/00*   (2006.01)
  *A46B 13/00*  (2006.01)
  *A46B 15/00*  (2006.01)
(52) U.S. Cl.
  CPC ................ B08B 1/006 (2013.01); B08B 1/04 (2013.01); H01L 21/02041 (2013.01); H01L 21/67046 (2013.01); A46B 2200/30 (2013.01)
(58) Field of Classification Search
  USPC .......................... 15/21.1, 77, 88.2, 88.3, 102
  See application file for complete search history.

(56) References Cited

FOREIGN PATENT DOCUMENTS

| | | | |
|---|---|---|---|
| JP | 08-306649 | A | 11/1996 |
| JP | 10-242092 | * | 9/1998 |
| JP | 11-204483 | A | 7/1999 |
| JP | 2000-164555 | A | 6/2000 |
| JP | 2000-271856 | A | 10/2000 |
| JP | 2001-105298 | A | 4/2001 |
| JP | 2001-293445 | A | 10/2001 |
| JP | 2002-050602 | A | 2/2002 |
| JP | 2002-313765 | A | 10/2002 |
| JP | 2002-313767 | A | 10/2002 |
| JP | 2008-130820 | A | 6/2008 |
| JP | 2010-129704 | A | 6/2010 |

* cited by examiner

SUBSTRATE CLEANING APPARATUS AND SUBSTRATE PROCESSING APPARATUS

TECHNICAL FIELD

The present invention relates to a substrate cleaning apparatus and a substrate processing apparatus having the substrate cleaning apparatus for performing scrub cleaning of a surface of a substrate, such as a semiconductor wafer, with an elongated cylindrical roll cleaning member extending horizontally, by rotating both of the substrate and the roll cleaning member in one direction respectively while keeping the roll cleaning member in contact with the surface of the substrate.

BACKGROUND ART

In a substrate cleaning apparatus for performing scrub cleaning of a surface of a substrate, such as a semiconductor wafer, with a roll cleaning member, the roll cleaning member needs to be pressed against the substrate under a predetermined pressing load (roll load) during cleaning of the substrate. Generally, the roll load is adjusted at the time of startup operation of the apparatus or at the time of maintenance of the apparatus. However, as described above, only by adjusting the roll load at the time of startup operation of the apparatus or at the time of maintenance of the apparatus, the roll load which is actually applied onto the substrate when the roll cleaning member is pressed against the substrate to clean the substrate cannot be grasped accurately due to variation of the property of the roll cleaning member, a time-dependent change of the roll cleaning member, or the like.

Therefore, there has been known a feedback control of a roll load by constructing a closed-loop control (CLC) system in which, for example, supply pressures of air supplied to an air cylinder used for applying the roll load to a substrate by moving a roll cleaning member up and down are measured and a regulating device is controlled based on the measured values. However, because the supply pressures of air are nothing but alternative property, the supply pressures of air do not precisely indicate the roll load actually applied to the substrate during cleaning of the substrate.

Further, there has been known a feedback control of a roll load by constructing a closed-loop control system in which a pressure sensor such as a load cell for measuring a roll load applied to a substrate by a roll cleaning member is provided in a cleaning apparatus and a regulating device is controlled based on the measured values (see patent documents 1 to 3).

Furthermore, in order to enhance control accuracy of a contact pressure (roll load) applied to the substrate so that the cleaning member can thoroughly follow the deflection of a surface (surface to be cleaned) caused by substrate warpage, there has been proposed a device in which a contact pressure is detected by a load detecting sensor, and an actuating mechanism of a mounting shaft having a distal end to which a cleaning member is attached is controlled based on the detected results (see patent document 4). Also, there has been proposed a device in which while a substrate is cleaned by a cleaning brush incorporating a pressure sensor, a brush pressure detected by the pressure sensor is monitored and a brush pressure control mechanism is controlled so that the brush pressure coincides with a target value (see patent document 5).

As an internal pressure stabilizing apparatus for a fluid pressurization type carrier, there has been known a device in which a pressure value inside a pressure chamber is detected by a pressure sensor, and when the detected pressure value differs from a desired pressure value, a valve of an electropneumatic converter is adjusted to cause an internal pressure of the pressure chamber to coincide with the desired pressure value (see patent document 6). Further, in a polishing apparatus, there has been proposed a load cell installed immediately above a gimbal device (tilting mechanism) of a substrate carrier for holding and rotating a substrate (see patent document 7).

CITATION LIST

Patent Literature

Patent document 1: Japanese patent No. 3397525
Patent document 2: Japanese laid-open patent publication No. 11-204483
Patent document 3: Japanese laid-open patent publication No. 2002-50602
Patent document 4: Japanese laid-open patent publication No. 2001-293445
Patent document 5: Japanese laid-open patent publication No. 2002-313765
Patent document 6: Japanese laid-open patent publication No. 2001-105298
Patent document 7: Japanese laid-open patent publication No. 2000-271856

SUMMARY OF INVENTION

Technical Problem

In the conventional substrate cleaning apparatus which cleans the substrate by pressing the roll cleaning member against the substrate, there are generally mechanical friction force, strain, backlash, and the like (as specific structures, a bearing, a bush, a link rod, a beam, a projection, a cantilever structure, and the like are included) between the roll cleaning member and the pressure sensor for measuring the roll load. Therefore, the difference between the measured pressure value (measured value) by the pressure sensor and the roll load actually applied to the substrate during cleaning of the substrate becomes larger, and thus the reliability as a pressure detecting-measuring system is low before performing feedback control of the roll load by using a closed-loop control system.

Accordingly, there are cases where the roll load (actual roll load) actually applied to the substrate during cleaning of the substrate fluctuates with respect to a preset roll load, or is shifted from the preset roll load. In this manner, if there is a difference between the roll load (actual roll load) actually applied to the substrate during cleaning of the substrate and the preset roll load, it is thought that the cleaning apparatus cannot fully exert its inherent cleaning performance.

As described above, in the current circumstances, it is hard to say that the roll load actually applied to the substrate during cleaning of the substrate is controlled in a rigorous manner and with high accuracy. Since the roll load cannot be detected and measured accurately, it has been generally difficult to determine the optimum roll load.

The present invention has been made in view of the above circumstances. It is therefore an object of the present invention to provide a substrate cleaning apparatus which can measure a roll load, with high accuracy, actually applied to a substrate by a roll cleaning member during cleaning of the substrate, and can control the roll load with high accuracy.

Solution to Problem

According to the present invention, there is provided a substrate cleaning apparatus for cleaning a substrate, comprising: a roll holder configured to support a horizontally elongated roll cleaning member and rotate the roll cleaning member; a vertical movement mechanism, having a vertically movable unit vertically movable by actuation of an actuator having a regulating device, configured to vertically move the roll holder coupled to the vertically movable unit so that the roll cleaning member applies a predetermined roll load to the substrate at the time of cleaning the substrate; a load cell provided between the vertically movable unit of the vertical movement mechanism and the roll holder and configured to measure the roll load; and a controller configured to perform feedback control of the roll load through the regulating device of the actuator based on a measured value of the load cell.

In this manner, by providing the load cell between the vertically movable unit of the vertical movement mechanism and the roll holder coupled to the vertically movable unit, a structure in which the load cell receives the entire own weight of the roll holder can be established, and a structure in which a bearing or a link rod which increases a friction during vertical movement of the roll holder, or a beam structure, a projection or the like which causes a loss in load transmission is not provided between the roll holder and the load cell can be established. Therefore, the roll load applied to the substrate during cleaning of the substrate can be transmitted to the load cell accurately, and thus the roll load can be measured and controlled with high accuracy.

In a preferred aspect of the present invention, the vertically movable unit of the vertical movement mechanism comprises a vertically movable shaft vertically movable by actuation of the actuator, or a vertically movable arm extending in a horizontal direction and having a base end coupled to the vertically movable shaft.

The vertically movable unit of the vertical movement mechanism preferably comprises a vertically movable shaft which is vertically movable along a vertical line passing through the center of gravity of the roll holder. However, depending on the relation of an installation space or the like, the vertically movable unit of the vertical movement mechanism may comprise a vertically movable arm extending in the horizontal direction.

In a preferred aspect of the present invention, a tilting mechanism is provided between the vertically movable unit of the vertical movement mechanism and the roll holder and configured to tilt the roll holder.

Thus, while keeping the horizontal attitude of the roll cleaning member held by the roll holder, the roll cleaning member is brought into contact with the substrate uniformly over substantially the entire length of the roll cleaning member and is allowed to follow the substrate when warpage or inclination of the substrate, flapping of the substrate caused by its rotation, or the like occurs. Thus, the roll load is applied to the substrate uniformly to thereby improve the cleaning performance, and the repulsive force from the substrate is received by the entire roll cleaning member to thereby improve the measurement accuracy of the roll load.

In a preferred aspect of the present invention, the load cell is provided at a substantially central area along a longitudinal direction of the roll holder and is coupled to the vertically movable unit of the vertical movement mechanism.

Thus, the center of gravity of the roll holder for supporting and rotating the roll cleaning member passes through the center of the load cell or a location close to the center of the load cell, thereby coupling the roll holder to the vertically movable unit in a well-balanced manner.

In a preferred aspect of the present invention, the controller is configured to start the feedback control of the roll load from when the roll load is applied to the substrate.

In this manner, the controller is configured so as not to perform the feedback control of the roll load before the roll load is applied to the substrate, and thus the initial disturbance of the roll load can be prevented and the time required for the roll load to reach a preset roll load can be shortened.

In a preferred aspect of the present invention, the controller arbitrarily sets, for each preset roll load, timing to start the feedback control of the roll load applied to the substrate.

With this configuration also, the initial disturbance of the roll load can be prevented and the time required for the roll load to reach a preset roll load can be shortened.

In a preferred aspect of the present invention, an electropneumatic regulator is used as the regulating device, and the controller arbitrarily sets, for each preset roll load, an operation amount of the electropneumatic regulator before starting the feedback control of the roll load applied to the substrate.

For example, in the case where the preset roll load is 2N, the operation amount of the electropneumatic regulator when starting the feedback control of the roll load is set so that a valve opening degree becomes 20%. In the case where the preset roll load is 10N, the operation amount of the electropneumatic regulator is set so that the valve opening degree becomes 60%. With this configuration also, the initial disturbance of the roll load can be prevented and the time required for the roll load to reach a preset roll load can be shortened.

According to the present invention, there is provided a substrate processing apparatus having the above substrate cleaning apparatus.

Advantageous Effects of Invention

According to the substrate cleaning apparatus of the present invention, the roll load actually applied to the substrate during cleaning of the substrate can be monitored. Further, the roll load is transmitted to the load cell accurately to thereby measure the roll load with high accuracy, and a difference between the roll load (actual roll load) actually applied to the substrate and a measured value (measured roll load) measured by the load cell is reduced to thereby control the roll load with high accuracy.

DESCRIPTION OF EMBODIMENTS

Figure 1:
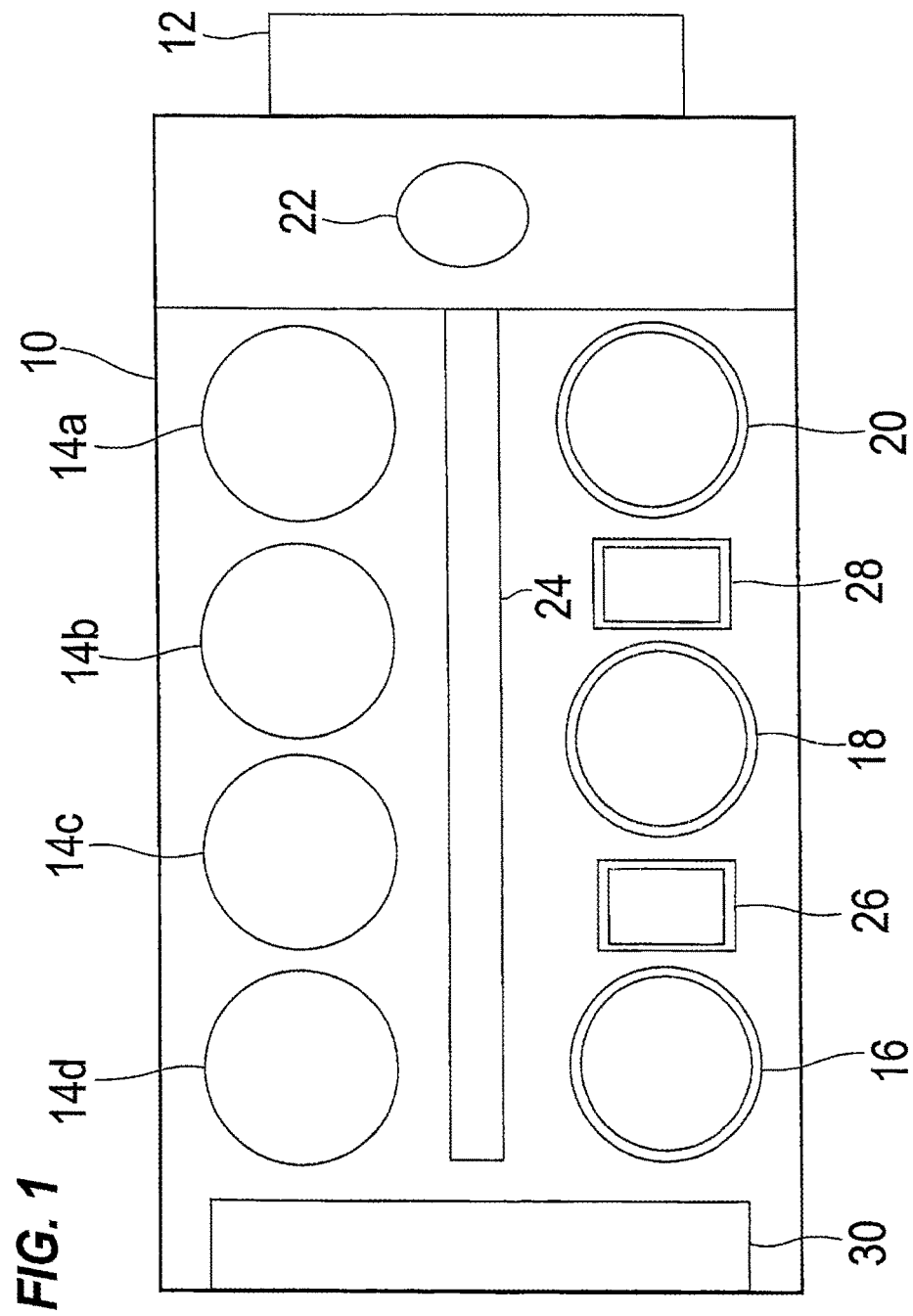
FIG. 1 is a plan view showing an entire structure of a substrate processing apparatus incorporating a substrate cleaning apparatus according to an embodiment of the present invention.

Embodiments of the present invention will be described below with reference to drawings. In the following examples, identical or corresponding parts are denoted by identical reference numerals, and will not be described in duplication.

FIG. 1 is a plan view showing an entire structure of a substrate processing apparatus incorporating a substrate cleaning apparatus according to an embodiment of the present invention. As shown in FIG. 1, the substrate processing apparatus includes a generally-rectangular housing 10, and a loading port 12 for placing thereon a substrate cassette storing a large number of substrates, such as semiconductor wafers. The loading port 12 is disposed adjacent to the housing 10 and is capable of placing thereon an open cassette, a SMIF (standard manufacturing interface) pod or a FOUP (front opening unified pod). Each of the SMIF and the FOUP is a hermetically sealed container which houses therein a substrate cassette and is covered with a partition wall, and thus can keep independent internal environment isolated from an external space.

In the housing 10, there are provided a plurality of (four in this example) polishing units 14a, 14b, 14c, 14d, a first substrate cleaning unit 16 and a second substrate cleaning unit 18 each for cleaning a substrate after polishing, and a substrate drying unit 20 for drying a substrate after cleaning. The polishing units 14a, 14b, 14c, 14d are arranged in the longitudinal direction of the substrate processing apparatus, and the substrate cleaning units 16, 18 and the substrate drying unit 20 are also arranged in the longitudinal direction of the substrate processing apparatus. The substrate cleaning apparatus according to the embodiment of the present invention is applied to the first substrate cleaning unit 16.

A first substrate transfer robot 22 is disposed in an area surrounded by the loading port 12, and the polishing unit 14a and the substrate drying unit 20 which are located near the loading port 12. Further, a substrate transport unit 24 is disposed in parallel to the polishing units 14a, 14b, 14c, 14d. The first substrate transfer robot 22 receives a substrate before polishing from the loading port 12 and transfers the substrate to the substrate transport unit 24, and receives a substrate after drying from the substrate drying unit 20 and returns the substrate to the loading port 12. The substrate transport unit 24 transports a substrate received from the first substrate transfer robot 22, and transfers the substrate between the substrate transport unit 24 and the polishing units 14a, 14b, 14c, 14d.

Between the first substrate cleaning unit 16 and the second substrate cleaning unit 18, there is provided a second substrate transfer robot 26 for transferring a substrate between the first substrate cleaning unit 16 and the second substrate cleaning unit 18. Between the second substrate cleaning unit 18 and the substrate drying unit 20, there is provided a third substrate transfer robot 28 for transferring a substrate between the substrate cleaning unit 18 and the substrate drying unit 20. In the housing 10, there is provided a control panel (operation panel) 30 for inputting a preset value of the roll load and the like, described below.

Figure 2:
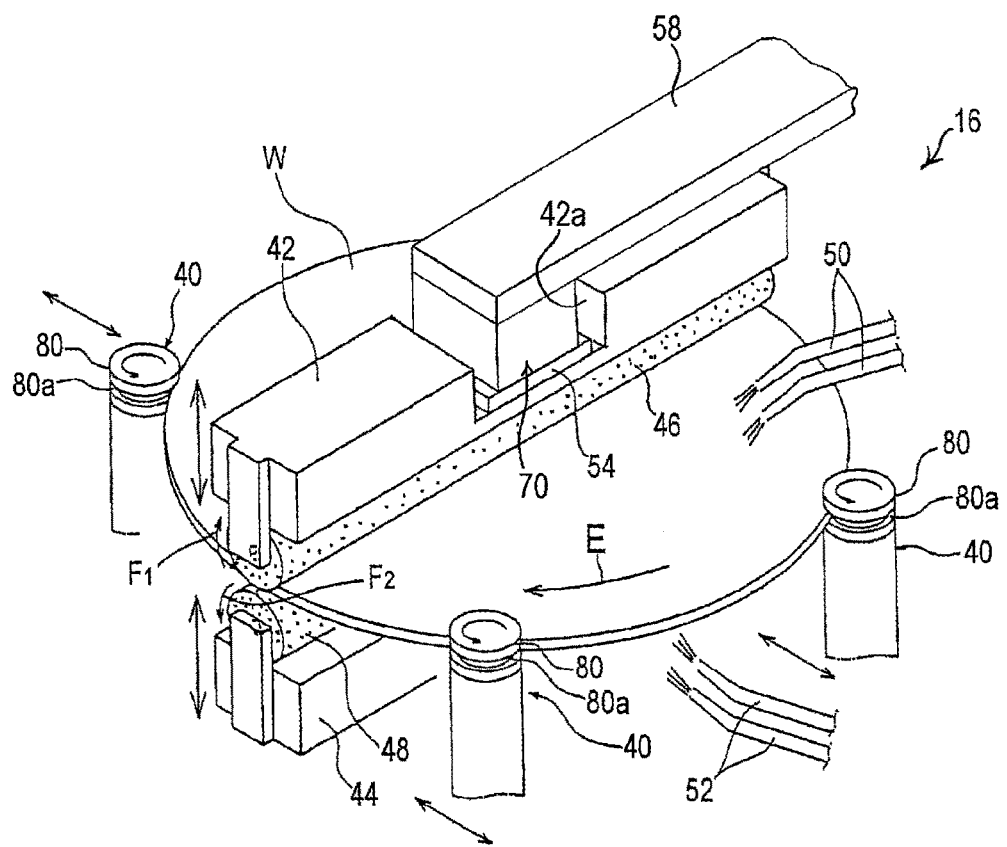
FIG. 2 is a schematic perspective view showing the substrate cleaning apparatus, according to an embodiment of the present invention, which is incorporated in the substrate processing apparatus shown in FIG. 1.
Figure 3:
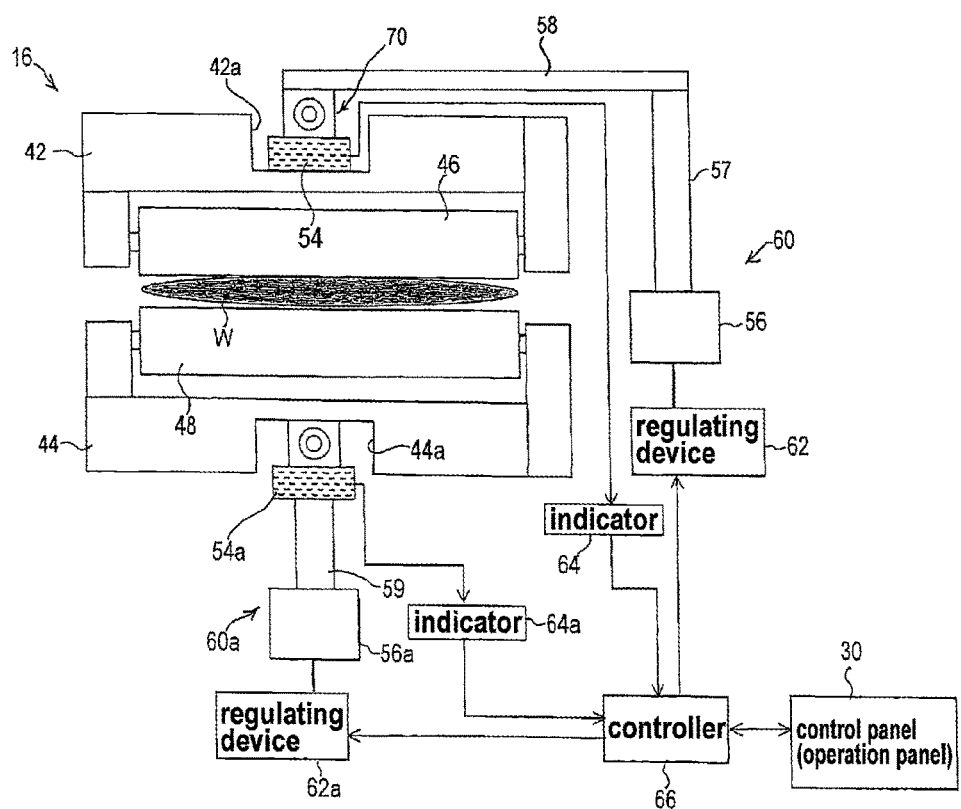
FIG. 3 is a front schematic elevational view showing an entire structure of the substrate cleaning apparatus according to the embodiment of the present invention.

FIG. 2 is a schematic perspective view showing the (first) substrate cleaning unit 16, according to an embodiment of the present invention, incorporated in the substrate processing apparatus shown in FIG. 1. FIG. 3 is a front schematic elevational view showing an entire structure of the substrate cleaning unit 16 according to the embodiment of the present invention.

As shown in FIGS. 2 and 3, the substrate cleaning unit 16 includes a plurality of (four as illustrated) horizontally movable spindles 40 for supporting a periphery of a substrate W, such as a semiconductor wafer, with its front surface facing upwardly, and horizontally rotating the substrate W, a vertically movable upper roll holder 42 disposed above the substrate W rotatably supported by the spindles 40, and a vertically movable lower roll holder 44 disposed below the substrate W rotatably supported by the spindles 40.

An elongated cylindrical upper roll cleaning member (roll sponge) 46 made of PVA or the like, is rotatably supported by the upper roll holder 42. The upper roll cleaning member 46 is rotated by a driving mechanism (not shown) in the direction shown by the arrow $F_1$ in FIG. 2. An elongated cylindrical lower roll cleaning member (roll sponge) 48, made of PVA or the like, is rotatably supported by the lower roll holder 44. The lower roll cleaning member 48 is rotated by a driving mechanism (not shown) in the direction shown by the arrow $F_2$ in FIG. 2.

An upper cleaning liquid supply nozzle 50 for supplying a cleaning liquid onto the front surface (upper surface) of the substrate W is disposed above the substrate W rotatably supported by the spindles 40. A lower cleaning liquid supply nozzle 52 for supplying a cleaning liquid onto the back surface (lower surface) of the substrate W is disposed below the substrate W rotatably supported by the spindles 40.

A recess 42a is provided at a substantially central area along the longitudinal direction of the upper roll holder 42, and a load cell 54 is located inside the recess 42a and is fixed to the upper roll holder 42. In this example, there is provided a vertical movement mechanism 60 comprising an air cylinder 56 disposed in the vertical direction to serve as an actuator, a vertically movable shaft 57 vertically movable by actuation of the air cylinder (actuator) 56, and a vertically movable arm 58, as a vertically movable unit, extending in a horizontal direction and having a base end connected to the upper end of the vertically movable shaft 57. The upper roll holder 42 is coupled via the load cell 54 to a lower end of a free end side of the vertically movable arm (vertically movable unit) 58.

With this configuration, the upper roll holder 42 is vertically moved together with the vertically movable shaft 57 and the vertically movable arm 58, by actuation of the air cylinder 56. The air cylinder 56 is provided with an electropneumatic regulator 62, as a regulating device, for regulating a supply pressure of air to be supplied to an interior of the air cylinder 56. By adjusting a valve opening degree of the electropneumatic regulator (regulating device) 62, the pressure of air to be supplied into the air cylinder 56 is regulated.

In this manner, the upper roll holder 42 is coupled to the lower surface of the free end side of the vertically movable arm 58 at the substantially central area along the longitudinal direction of the upper roll holder 42 so that the center of gravity of the upper roll holder 42 which supports and rotates the upper roll cleaning member 46, passes through the center of the load cell 54 or a location close to the center of the load cell 54, thereby coupling the upper roll holder 42 to the lower surface of the free end side of the vertically movable arm 58 in a horizontal state and a well-balanced manner.

Further, the own weight of the upper roll holder 42 can be transmitted to the load cell 54 without any loss by coupling the upper roll holder 42 to the lower end of the free end side of the vertically movable arm 58 via the load cell 54. When the upper roll holder 42 is lowered to bring the upper roll cleaning member 46 into contact with the substrate W at the time of cleaning the substrate W, a tensile load applied to the load cell 54 is reduced by a certain amount which substantially coincides with the roll load (pressing load) applied to the substrate W by the upper roll cleaning member 46.

Accordingly, the roll load applied to the substrate W by the upper roll cleaning member 46 during cleaning of the substrate W is measured by the load cell 54 based on the reduced tensile load, and the valve opening degree is adjusted by an operation amount of the electropneumatic regulator 62, thereby regulating the roll load.

The measured value measured by the load cell 54 is sent, from an indicator 64 of the load cell 54, in analog signal to a controller 66 as a control unit, and the analog signal sent from the controller (control unit) 66 is inputted to the electropneumatic regulator 62. Thus, a closed-loop control system for performing a closed-loop control is constructed. Further, a preset value such as preset roll load is inputted from the control panel (operation panel) 30 to the controller 66.

With this configuration, the controller 66 compares the measured value (measured roll load) measured by the load cell 54 and the preset roll load inputted from the control panel (operation panel) 30 and gives the electropneumatic regulator 62 an instruction of an operation amount of an opening and closing valve, depending on a difference between the measured roll load and the preset roll load. The electropneumatic regulator 62 automatically adjusts the valve opening degree in response to the instruction from the controller 66 to vary a thrust force of the air cylinder 56 with the adjusted valve opening degree, thereby performing feedback control of the roll load applied to the substrate W during cleaning of the substrate W.

According to this example, by providing the load cell 54 between the vertically movable arm 58 of the vertical movement mechanism 60 and the upper roll holder 42 coupled to the vertically movable arm 58, a structure in which the load cell 54 receives the own weight of the upper roll holder 42 can be established. Further, a structure in which a bearing or a link rod which increases a friction during vertical movement of the upper roll holder 42, or a beam structure, a projection or the like which causes a loss in load transmission is not provided between the upper roll holder 42 and the load cell 54 can be established. Therefore, the roll load applied to the substrate W during cleaning of the substrate can be transmitted to the load cell 54 accurately, and thus the roll load can be measured and controlled with high accuracy.

Figure 4:
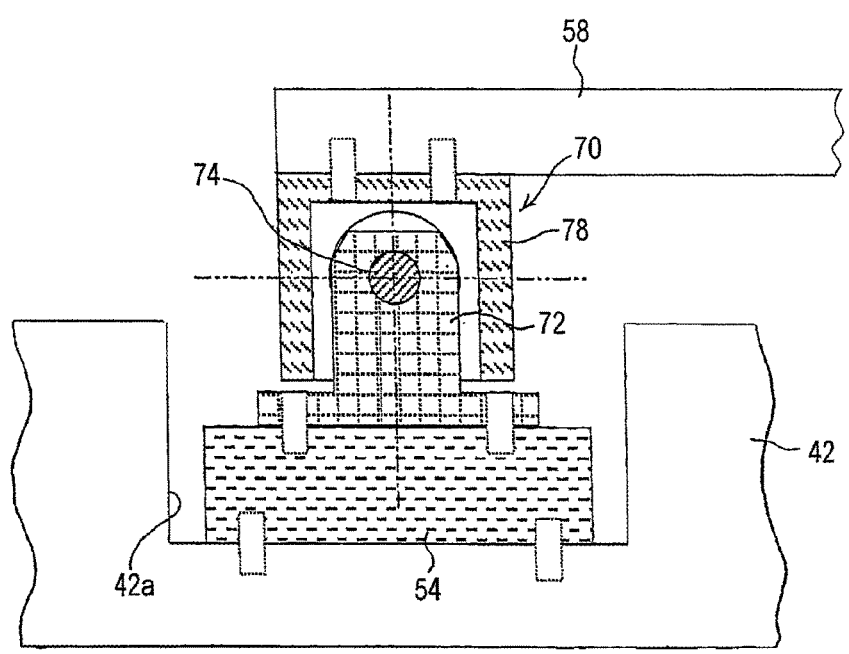
FIG. 4 is a front sectional elevational view of a tilting mechanism provided at an upper roll holder side.
Figure 5:
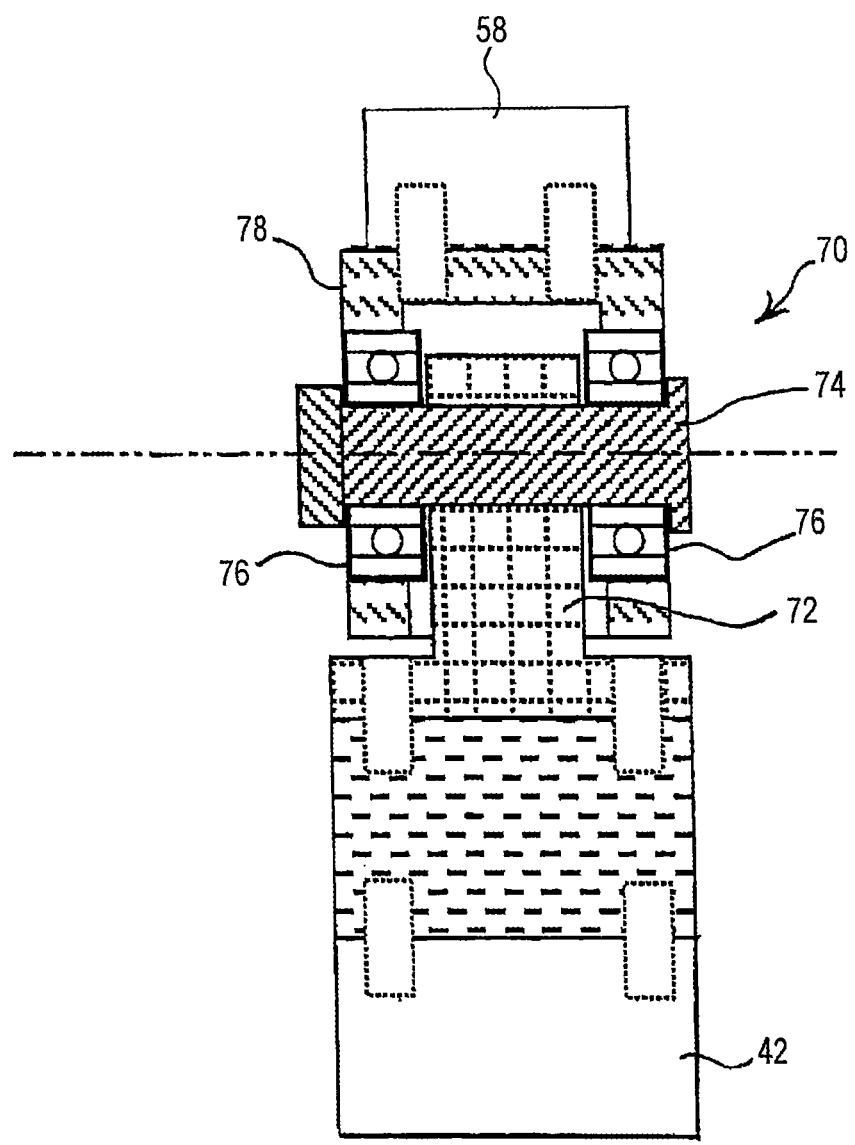
FIG. 5 is a side sectional elevational view of the tilting mechanism provided at the upper roll holder side.

A tilting mechanism 70 for tilting the upper roll holder 42 is disposed between the load cell 54 and the lower surface of the free end side of the vertically movable arm 58. Specifically, as shown in FIGS. 4 and 5, a bracket 72 is fixed to the load cell 54, and a bearing casing 78 to which a pair of bearings 76 for rotatably supporting a shaft 74 is attached is fixed to the lower surface of the free end side of the vertically movable arm 58. The shaft 74 supported by the bearings 76 passes through a through-hole provided in the bracket 72, and is fixed to the bracket 72. Thus, the tilting mechanism 70 for tilting the upper roll holder 42, to which the load cell 54 is fixed, about the shaft 74 in a direction of $Y_1$ shown in FIG. 4 is constituted.

In this manner, by providing the tilting mechanism 70, while keeping the horizontal attitude of the upper roll cleaning member 46 held by the upper roll holder 42, the upper roll cleaning member 46 is brought into contact with the substrate W uniformly over substantially the entire length of the upper roll cleaning member 46 and is allowed to follow the substrate W when warpage or inclination of the substrate W, flapping of the substrate W caused by its rotation, or the like occurs. Thus, the roll load is applied to the substrate W uniformly to thereby improve the cleaning performance, and the repulsive force from the substrate W is received by the entire upper roll cleaning member 46 to thereby improve the measurement accuracy of the roll load.

A recess 44a is provided at a substantially central area along the longitudinal direction of the lower roll holder 44. The lower roll holder 44 has a vertical movement mechanism 60a comprising an air cylinder 56a disposed in the vertical direction to serve as an actuator, and a vertically movable shaft 59 as a vertically movable unit vertically movable by actuation of the air cylinder (actuator) 56a. The lower roll holder 44 is coupled via a load cell 54a to an upper end surface of the vertically movable shaft (vertically movable unit) 59. With this configuration, the lower roll holder 44 is vertically moved together with the vertically movable shaft 59 by actuation of the air cylinder 56a. The air cylinder 56a is provided with an electropneumatic regulator 62a serving as a regulating device, in the same manner as the above.

In this manner, the lower roll holder 44 is coupled to the upper end surface of the vertically movable shaft 59 at the substantially central area along the longitudinal direction of the lower roll holder 44 so that the center of gravity of the lower roll holder 44 which supports and rotates the lower roll cleaning member 48, passes through the center of the load cell 54a or a location close to the center of the load cell 54a, thereby coupling the lower roll holder 44 to the vertically movable shaft 59 in a horizontal state and a well-balanced manner.

Further, the own weight of the lower roll holder 44 can be transmitted to the load cell 54a without any loss by coupling the lower roll holder 44 to the upper end surface of the vertically movable shaft 59 via the load cell 54a. When the lower roll holder 44 is lifted to bring the lower roll cleaning member 48 into contact with the substrate W, a compressive load applied to the load cell 54 is increased by a certain amount which substantially coincides with the roll load (pressing load) applied to the substrate W by the lower roll cleaning member 48.

Accordingly, the roll load applied to the substrate W by the lower roll cleaning member 48 during cleaning of the substrate W is measured by the load cell 54a based on the increased compressive load and the valve opening degree is adjusted by an operation amount of the electropneumatic regulator (regulating device) 62a, thereby regulating the roll load.

The measured value measured by the load cell 54a sent, from an indicator 64a of the load cell 54a, in analog signal to the controller 66, and the analog signal sent from the controller 66 is inputted to the electropneumatic regulator 62a. Thus, a closed-loop control system for performing a closed-loop control is constructed. Further, a preset value such as preset roll load is inputted from the control panel (operation panel) 30 to the controller 66.

With this configuration, the controller 66 compares the measured value (measured roll load) measured by the load cell 54a and the preset roll load inputted from the control panel (operation panel) 30 and gives the electropneumatic regulator 62a an instruction of an operation amount of an opening and closing valve depending on a difference between the measured roll load and the preset roll load. The electropneumatic regulator 62a automatically adjusts the valve opening degree in response to the instruction from the controller 66 to vary a thrust force of the air cylinder 56a with the adjusted valve opening degree, thereby performing feedback control of the roll load applied to the substrate W during cleaning of the substrate W.

According to this example, by providing the load cell 54a between the vertically movable shaft 59 of the vertical movement mechanism 60a and the lower roll holder 44 coupled to the vertically movable shaft 59, a structure in which the load cell 54a receives the own weight of the lower roll holder 44 can be established. Further, a structure in which a bearing or a link rod which increases a friction during vertical movement of the lower roll holder 44, or a beam structure, a projection or the like which causes a loss in load transmission is not provided between the lower roll holder 44 and the load cell 54a can be established. Therefore, the roll load applied to the substrate W during cleaning of the substrate can be transmitted to the load cell 54a accurately, and thus the roll load can be measured and controlled with high accuracy.

Figure 6:
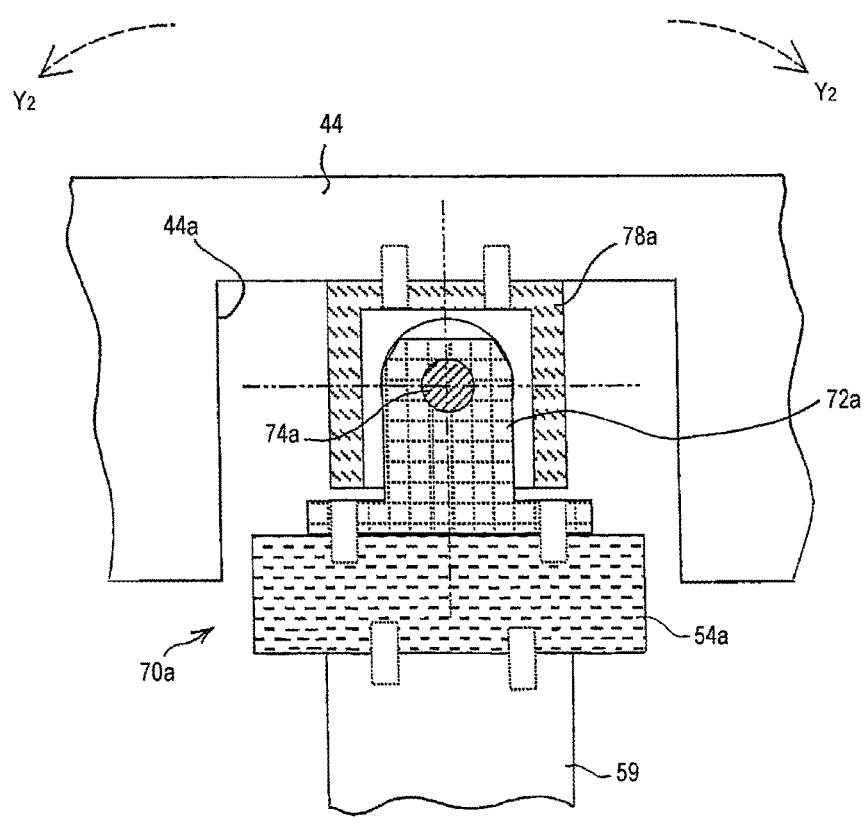
FIG. 6 is a front sectional elevational view of a tilting mechanism provided at a lower roll holder side.

A tilting mechanism 70a for tilting the lower roll holder 44 is disposed between the load cell 54a fixed to the upper end surface of the vertically movable shaft 59 and the lower roll holder 44. Specifically, as shown in FIG. 6, a bracket 72a is fixed to the load cell 54a fixed to the upper end surface of the vertically movable shaft 59, and a bearing casing 78a to which a pair of bearings for rotatably supporting a shaft 74a is attached is fixed to the lower roll holder 44. The shaft 74a supported by the bearings passes through a through-hole provided in the bracket 72a, and is fixed to the bracket 72a. Thus, the tilting mechanism 70a for tilting the lower roll holder 44 about the shaft 74a in a direction of $Y_2$ shown in FIG. 6 is constituted.

In this manner, by providing the tilting mechanism 70a, while keeping the horizontal attitude of the lower roll cleaning member 48 held by the lower roll holder 44, the lower roll cleaning member 48 is brought into contact with the substrate W uniformly over substantially the entire length of the lower roll cleaning member 48 and is allowed to follow the substrate W when warpage or inclination of the substrate W, flapping of the substrate W caused by its rotation, or the like occurs. Thus, the roll load is applied to the substrate uniformly to thereby improve the cleaning performance, and the repulsive force from the substrate is received by the entire lower roll cleaning member 48 to thereby improve the measurement accuracy of the roll load. Further, mechanical backlash or friction hardly occurs in the tilting mechanism 70a in response to the vertical compressive load and the vertical tensile load. Furthermore, the tilting mechanism 70a is not brought into contact with anything other than the lower roll holder 44 and the load cell 54a. Therefore, the own weight of the lower roll holder 44 is transmitted to the load cell 54a without any loss.

In the scrub cleaning apparatus having the above configuration, as shown in FIG. 2, a peripheral portion of the substrate W is located in an engagement groove 80a formed in a circumferential surface of a spinning top 80 provided at an upper portion of each of the spindles 40. By spinning (rotating) the spinning tops 80 while pressing them inwardly against the peripheral portion of the substrate W, the substrate W is rotated horizontally in the direction shown by the arrow E in FIG. 2. In this embodiment, two of the four spinning tops 80 apply a rotational force to the substrate W, while the other two spinning tops 80 function as a bearing for supporting the rotation of the substrate W. It is also possible to couple all the spinning tops 80 to a drive mechanism so that they all apply a rotational force to the substrate W.

While horizontally rotating the substrate W and supplying a cleaning liquid (chemical liquid) from the upper cleaning liquid supply nozzle 50 to the front surface (upper surface) of the substrate W, the upper roll cleaning member 46 is rotated and lowered to be brought into contact with the front surface of the rotating substrate W under a predetermined roll load, thereby performing scrub cleaning of the front surface of the substrate W with the upper roll cleaning member 46 in the presence of the cleaning liquid. The length of the upper roll cleaning member 46 is set to be slightly larger than the diameter of the substrate W, and thus the entire front surface of the substrate W can be cleaned at the same time.

When the front surface of the substrate W is scrub-cleaned with the upper roll cleaning member 46, the roll load applied to the substrate W by the upper roll cleaning member 46 is measured by the load cell 54. The controller 66 compares the measured value (measured roll load) and the preset roll load which has been inputted from the control panel 30, and gives an instruction of the operation amount of the opening and closing valve to the electropneumatic regulator 62 depending on a difference between the measured roll load and the preset roll load. The electropneumatic regulator 62 automatically adjusts the valve opening degree in response to the instruction from the controller 66 to vary a thrust force of the air cylinder 56 with the valve opening degree. Accordingly, the roll load applied to the substrate W during cleaning of the substrate W is feedback-controlled so that the roll load becomes equal to the preset roll load.

If the feedback control of the roll load is started before the upper roll cleaning member 46 applies the roll load to the substrate W, the measured value by the load cell 54 is disturbed by the vertical movement of the upper roll holder 42 or other causes. In such a case, when the disturbance of the measured value is picked up, the electropneumatic regulator 62 is more likely to become in an out-of-control state. Therefore, the feedback control of the roll load is preferably started from the time when the upper roll cleaning member 46 is brought into contact with the front surface of the substrate W and applies the roll load to the substrate W.

Thus, the initial disturbance of the roll load can be prevented and the time required for the roll load to reach the preset roll load can be shortened.

Further, the operation amount of the electropneumatic regulator 62 before starting the feedback control of the roll load applied to the substrate W is preferably set arbitrarily for each preset roll load. Specifically, the relationship between time and the roll load when the preset roll load is 6N, and the operation amounts of the electropneumatic regulator 62 before starting the feedback control of the roll load are set to valve opening degrees 40% and 20%, respectively, and then the roll load is feedback-controlled is shown in graph A and graph B in FIG. 7. The relationship between time and the roll load when the preset roll load is 6N, and the operation amount of the electropneumatic regulator 62 is set (fixed) to valve opening degree 30% and the roll load is not feedback-controlled is shown in graph C in FIG. 7.

Figure 7:
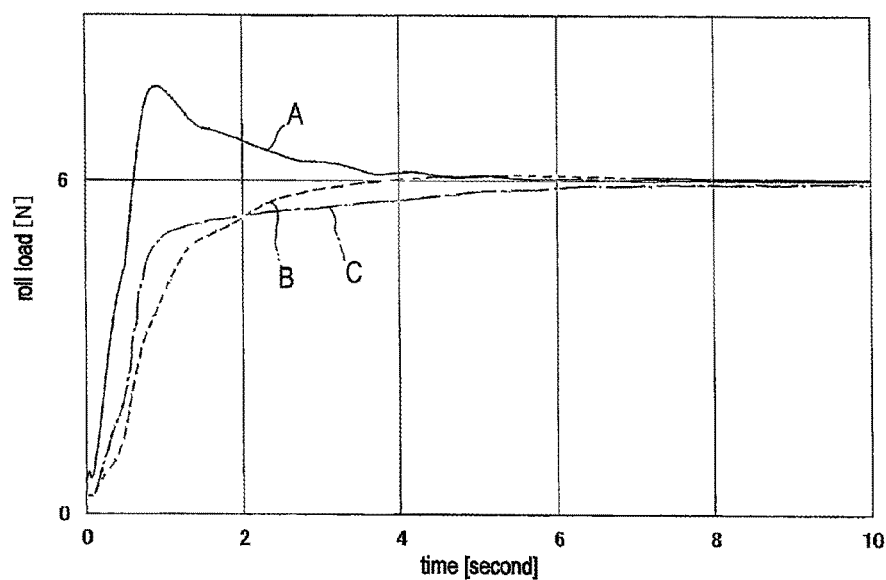
FIG. 7 is a graph showing the relationship between time and the roll load when the preset roll load is 6N, and the operation amounts of the electropneumatic regulator before starting the feedback control of the roll load are set to valve opening degrees 40% and 20%, respectively, and then the roll load is feedback-controlled, by using graph A and graph B, and showing the relationship between time and the roll load when the preset roll load is 6N, and the operation amount of the electropneumatic regulator is set (fixed) to valve opening degree 30% and the roll load is not feedback-controlled, by using graph C.

From the graphs A and C of FIG. 7, it is understood that the time required for the roll load to reach the preset roll load can be shortened by setting the operation amount of the electropneumatic regulator 62 before starting the feedback control of the roll load to valve opening degree 40%, as compared to the case where the operation amount of the electropneumatic regulator 62 is set to valve opening degree 30% and the roll load is not feedback-controlled. Further, from the graphs A and B of FIG. 7, it is understood that when the preset roll loads are the same, the time required for the roll load to reach the preset roll load can be changed by changing the operation amount of the electropneumatic regulator 62 before starting the feedback control of the roll load. It has been confirmed that the impact (overshoot amount) when the roll cleaning member is brought into contact with the substrate can be changed by changing the operation amount of the electropneumatic regulator 62 before starting the feedback control of the roll load.

Further, the timing to start the feedback control of the roll load applied to the substrate is preferably set arbitrarily for each preset roll load, so that the initial disturbance of the roll load can be prevented and the time required for the roll load to reach the preset roll load can be shortened.

The preset roll load, the operation amount of the electropneumatic regulator before starting the feedback control of the roll load, the timing to start the feedback control of the roll load, and the like are inputted beforehand from the control panel 30 to the controller 64, and the electropneumatic regulator 62 adjusts the valve opening degree and changes ON/OFF of the closed-loop control system in response to the instruction from the controller 64.

Simultaneously, while supplying a cleaning liquid from the lower cleaning liquid supply nozzle 52 to the back surface (lower surface) of the substrate W, the lower roll cleaning member 48 is rotated and lifted to be brought into contact with the back surface of the rotating substrate W under a predetermined roll load, thereby performing scrub cleaning of the back surface of the substrate W with the lower roll cleaning member 48 in the presence of the cleaning liquid. The length of the lower roll cleaning member 48 is set to be slightly larger than the diameter of the substrate W, and thus the entire back surface of the substrate W is cleaned simultaneously, as with the above-described front surface of the substrate W.

During scrub cleaning of the surface of the substrate W with the lower roll cleaning member 48, the roll load applied to the substrate W during cleaning of the substrate W is feedback-controlled so that the roll load becomes equal to the preset roll load, as with the case of the above-described upper roll cleaning member 46.

In the substrate processing apparatus shown in FIG. 1, the substrate taken out from a substrate cassette inside the loading port 12 is transferred to one of the polishing units 14*a*, 14*b*, 14*c*, 14*d*, and the surface of the substrate is polished by the specified polishing unit. The surface of the substrate which has been polished is cleaned (primarily cleaned) in the first substrate cleaning unit 16, and is then cleaned (finally cleaned) in the second substrate cleaning unit 18. Then, the cleaned substrate is removed from the second substrate cleaning unit 18 and transferred to the substrate drying unit 20 where the substrate is spin-dried. Thereafter, the dried substrate is returned into the substrate cassette inside the loading port 12.

In the above examples, although both of the roll load applied to the front surface (upper surface) of the substrate by the upper roll cleaning member 46 and the roll load applied to the back surface (lower surface) of the substrate by the lower roll cleaning member 48 are feedback-controlled using a closed-loop control system, either one of them may be feedback-controlled depending on use conditions (process, property of the substrate, load, and the like).

Figure 8:
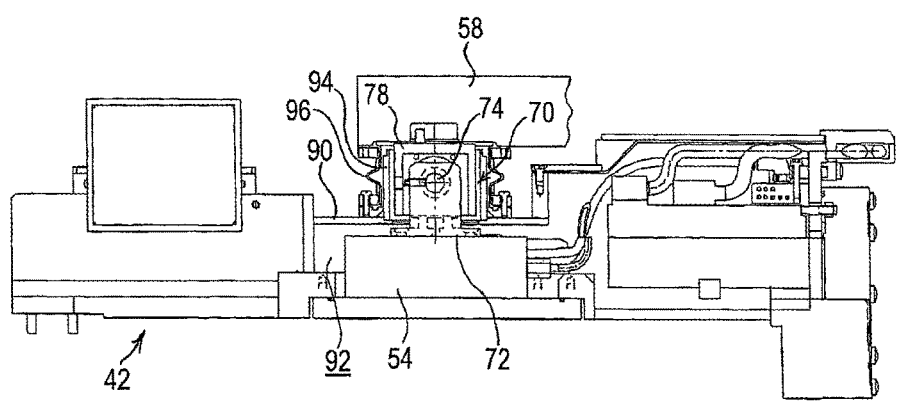
FIG. 8 is a front sectional elevational view showing another upper roll holder incorporating therein a load cell and a tilting mechanism.

FIG. 8 is a front sectional elevational view showing another upper roll holder 42 which incorporates therein a load cell 54 and a tilting mechanism 70. The upper roll holder 42 in this example differs from the above-described upper roll holder in the following respects.

Specifically, a storage chamber 92 having an upper portion covered by a covering plate 90 is formed in the upper roll holder 42, and the load cell 54 is housed in the storage chamber 92 and fixed to the upper roll holder 42. The bracket 72 of the tilting mechanism 70 is fixed to an upper surface of the load cell 54 and projects above the covering plate 90, and a bearing casing 78 of the tilting mechanism 70 is fixed to a lower surface of a free end side of the vertically movable arm (vertically movable unit) 58 extending horizontally. Further, a cylindrical member 94 having a lower end fixed to the covering plate 90 is disposed around the bearing casing 78, and a bellows-like and freely-bendable waterproof sheet 96 having a lower end coupled to the covering plate 90 and an upper end coupled to the lower surface of the free end side of the vertically movable ati 58 is disposed around the cylindrical member 94. With this configuration, during cleaning process, the tilting mechanism 70 and the load cell 54 are prevented from being wetted with a cleaning liquid used in the cleaning.

Figure 9:
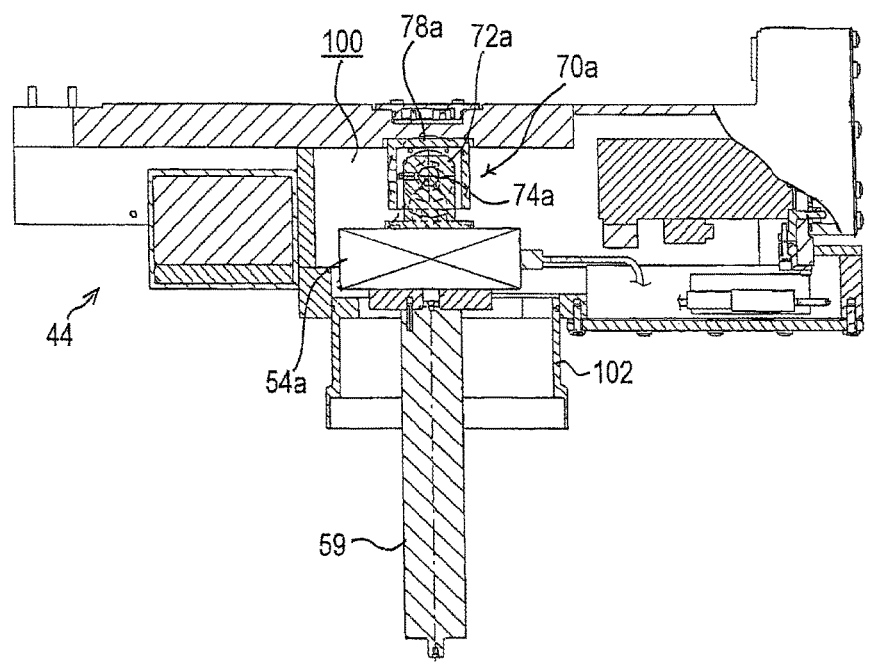
FIG. 9 is a front sectional elevational view showing another lower roll holder incorporating therein a load cell and a tilting mechanism.

FIG. 9 is a front sectional elevational view showing another lower roll holder 44 which incorporates therein a load cell 54*a* and a tilting mechanism 70*a*. The lower roll holder 44 in this example differs from the above-described lower roll holder in the following respects.

Specifically, the tilting mechanism 70*a* fixed to the lower roll holder 44 and the load cell 54*a* coupled to the tilting mechanism 70*a* are housed in a housing portion 100 which is formed in the lower roll holder 44 and opens downward. An upper portion of the vertically movable shaft (vertically movable unit) 59, having an upper end surface to which the load cell 54*a* is fixed, is surrounded by a cylindrical waterproof cover 102 suspended downward. With this configuration, during cleaning process, the tilting mechanism 70*a* and the load cell 54*a* are prevented from being wetted with a cleaning liquid used in the cleaning.

Although preferred embodiments have been described in detail above, it should be understood that the present invention is not limited to the illustrated embodiments, but many changes and modifications can be made therein without departing from the appended claims.

INDUSTRIAL APPLICABILITY

The present invention is applicable to a substrate cleaning apparatus and a substrate processing apparatus having the substrate cleaning apparatus for performing scrub cleaning of a surface of a substrate, such as a semiconductor wafer, with an elongated cylindrical roll cleaning member extending horizontally, by rotating both of the substrate and the roll cleaning member in one direction respectively while keeping the roll cleaning member in contact with the surface of the substrate.

REFERENCE SIGNS LIST 14a-14d polishing unit
16, 18 substrate cleaning unit
20 substrate drying unit
24 substrate transport unit
30 control panel (touch panel)
40 spindle
42, 44 roll holder
46, 48 roll cleaning member
54, 54a load cell
56, 56a air cylinder (actuator)
60, 60a vertical movement mechanism
62, 62a electropneumatic regulator (regulating device)
64, 64a indicator
66 controller (control unit)
70, 70a tilting mechanism
72, 72a bracket
74, 74a shaft
76, 76 bearing
78, 78a bearing casing

The invention claimed is:

1. A substrate cleaning apparatus for cleaning a substrate, comprising:
  a roll holder configured to support a horizontally elongated roll cleaning member and rotate the roll cleaning member;
  a vertical movement mechanism, having a vertically movable unit vertically movable by actuation of an actuator having a regulating device, configured to vertically move the roll holder coupled to the vertically movable unit so that the roll cleaning member applies a predetermined roll load to the substrate at the time of cleaning the substrate;
  a load cell provided between the vertically movable unit of the vertical movement mechanism and the roll holder and configured to measure the roll load;
  a controller configured to perform feedback control of the roll load through the regulating device of the actuator based on a measured value of the load cell; and
  a tilting mechanism provided between the vertically movable unit of the vertical movement mechanism and the roll holder and configured to tilt the roll holder,
  wherein the load cell is provided at a substantially central area along a longitudinal direction of the roll holder and is coupled to the vertically movable unit of the vertical movement mechanism.

2. The substrate cleaning apparatus according to claim 1, wherein the controller is configured to start the feedback control of the roll load from when the roll load is applied to the substrate.

3. The substrate cleaning apparatus according to claim 2, wherein an electropneumatic regulator is used as the regulating device, and the controller arbitrarily sets, for each preset roll load, an operation amount of the electropneumatic regulator before starting the feedback control of the roll load applied to the substrate.

4. The substrate cleaning apparatus according to claim 1, wherein the controller arbitrarily sets, for each preset roll load, timing to start the feedback control of the roll load applied to the substrate.

5. A substrate processing apparatus having a substrate cleaning apparatus according to claim 1.

6. The substrate cleaning apparatus according to claim 1, wherein the vertically movable unit of the vertical movement mechanism comprises a vertically movable shaft vertically movable by actuation of the actuator.

7. The substrate cleaning apparatus according to claim 1, wherein the tilt mechanism is configured to tilt the roll holder about an axis that is provided at a substantially central area along a longitudinal direction of the roll holder.

8. The substrate cleaning apparatus according to claim 1, wherein the tilt mechanism comprises a casing and a shaft rotatably coupled to the casing.

9. The substrate cleaning apparatus according to claim 8, wherein the casing is fixed to the vertically movable unit and the shaft is fixed to the roll holder.

10. The substrate cleaning apparatus according to claim 1, wherein the roll holder is coupled to the vertically movable unit at the substantially central area along the longitudinal direction of the roll holder.

11. The substrate cleaning apparatus according to claim 1, wherein the roll holder is coupled to the vertically movable unit at the substantially central area along the longitudinal direction of the roll holder such that a center of gravity of the roll holder passes through a center of the load cell.

12. A substrate cleaning apparatus for cleaning a substrate, comprising:
  a roll holder configured to support a horizontally elongated roll cleaning member and rotate the roll cleaning member;
  a vertical movement mechanism, having a vertically movable unit vertically movable by actuation of an actuator having a regulating device, configured to vertically move the roll holder coupled to the vertically movable unit so that the roll cleaning member applies a predetermined roll load to the substrate at the time of cleaning the substrate;
  a load cell provided between the vertically movable unit of the vertical movement mechanism and the roll holder and configured to measure the roll load;
  a controller configured to perform feedback control of the roll load through the regulating device of the actuator based on a measured value of the load cell; and
  a tilting mechanism provided between the vertically movable unit of the vertical movement mechanism and the roll holder and configured to tilt the roll holder,
  wherein the tilt mechanism is provided at a substantially central area along a longitudinal direction of the roll holder.

* * * * *

UNITED STATES PATENT AND TRADEMARK OFFICE
CERTIFICATE OF CORRECTION

PATENT NO. : 9,978,617 B2
APPLICATION NO. : 14/422248
DATED : May 22, 2018
INVENTOR(S) : Hideaki Tanaka Page 1 of 1

It is certified that error appears in the above-identified patent and that said Letters Patent is hereby corrected as shown below:

In the Specification

Column 12, Line 44, "movable ati" should read --movable arm--

Signed and Sealed this
Second Day of October, 2018

Andrei Iancu
*Director of the United States Patent and Trademark Office*